United States Patent [19]

Herberg

[11] Patent Number: 4,691,221

[45] Date of Patent: Sep. 1, 1987

[54] MONOLITHICALLY INTEGRATED BIPOLAR DARLINGTON CIRCUIT

[75] Inventor: Helmut Herberg, Munich, Fed. Rep. of Germany

[73] Assignee: Siemens Aktiengesellschaft, Berlin and Munich, Fed. Rep. of Germany

[21] Appl. No.: 762,458

[22] Filed: Aug. 5, 1985

[30] Foreign Application Priority Data

Sep. 27, 1984 [DE] Fed. Rep. of Germany ....... 3435571

[51] Int. Cl.⁴ .............................................. H01L 27/02
[52] U.S. Cl. ........................................ 357/46; 357/34; 357/36
[58] Field of Search ............................ 357/46, 34, 36; 307/315

[56] References Cited

U.S. PATENT DOCUMENTS 4,125,855 11/1978 Davis et al. ................... 357/36 X

FOREIGN PATENT DOCUMENTS 56-58260   5/1981  Japan ................................ 357/46
59-202667 11/1984  Japan ................................ 357/36
6708288  12/1967  Netherlands ....................... 357/36

OTHER PUBLICATIONS

Leturcq, "Power Bipolar Devices", *Microelectron. Reliab.*, vol. 24, No. 2, 1984, pp. 313–337.

Primary Examiner—Andrew J. James
Assistant Examiner—William Mintel
Attorney, Agent, or Firm—Hill, Van Santen, Steadman & Simpson

[57] ABSTRACT

A monolithically integrated bipolar Darlington circuit comprising a driver transistor and output transistor whereby a semiconductor body contains a base layer of a first conductivity type and a collector layer of a second conductivity type which is below the base layer and the driver transistor and the output transistor have emitters of the second conductivity type which are formed in the base layer and whereby the emitter of the driver transistor is conductively connected to a subregion of the base layer which lies between both transistors. The object is to obtain high switching speed when switching collector current on and off and this is achieved in that the emitter of the output transistor and the driver transistor are each composed of a plurality of emitter regions which are arranged such that each emitter region of the output transistor is positioned adjacent to at least one emitter region of the driver transistor such that every emitter region of the driver transistor is provided with a conductive coating which contacts the base layer between it and the neighboring emitter region of the output transistor. The invention can be utilized in power devices for the electronic arts.

10 Claims, 5 Drawing Figures

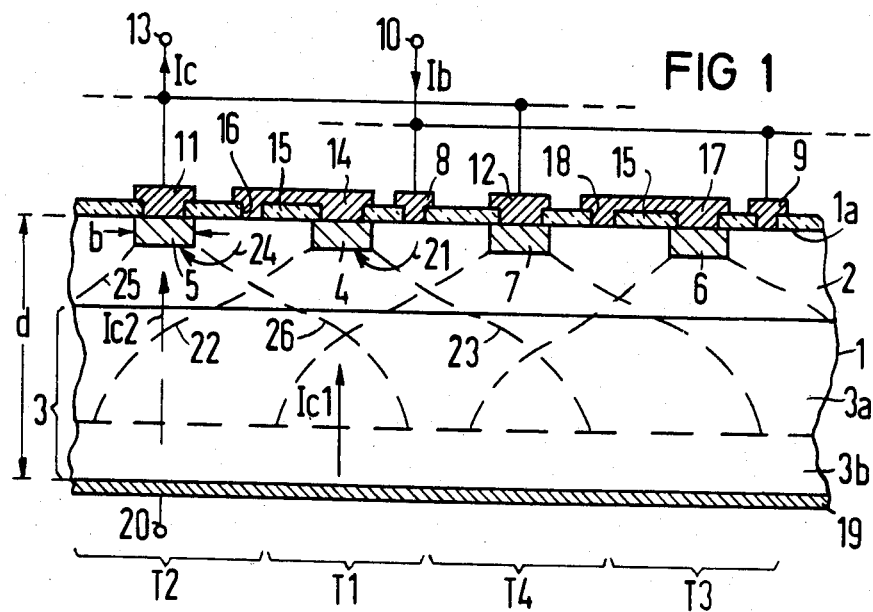
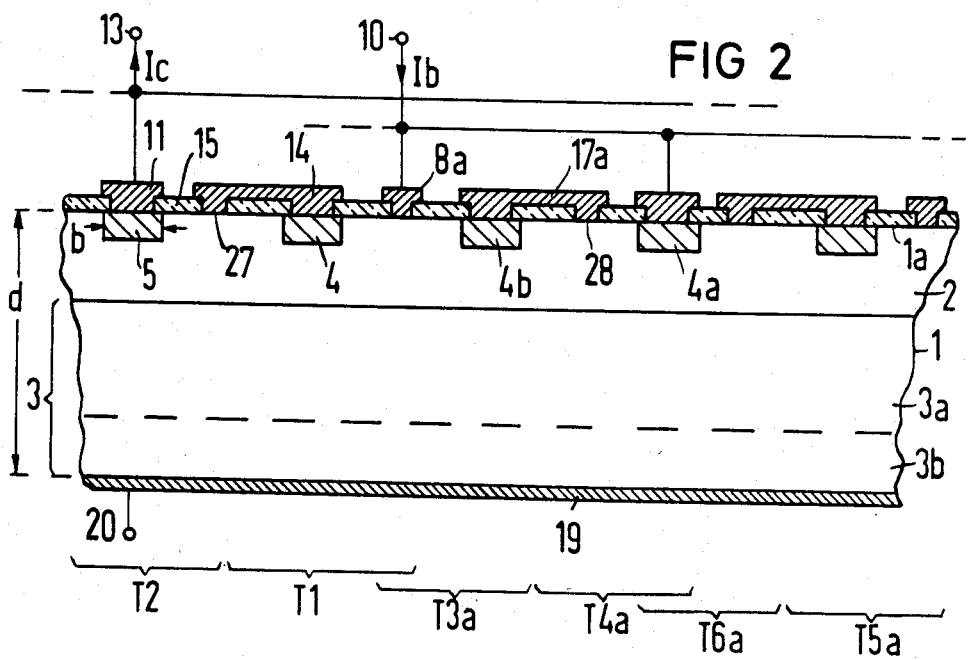

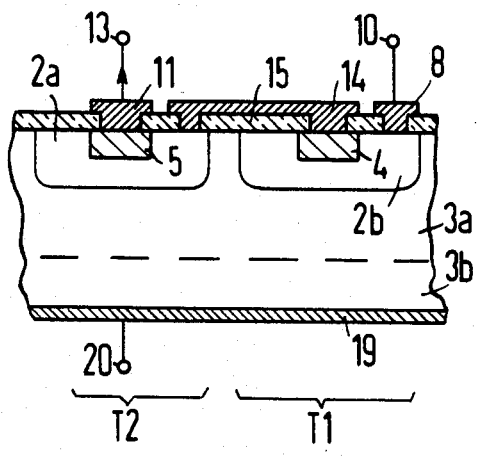
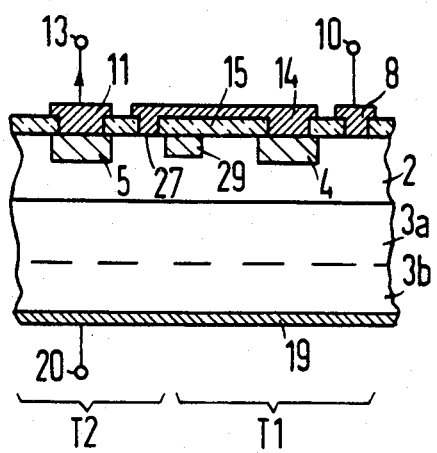
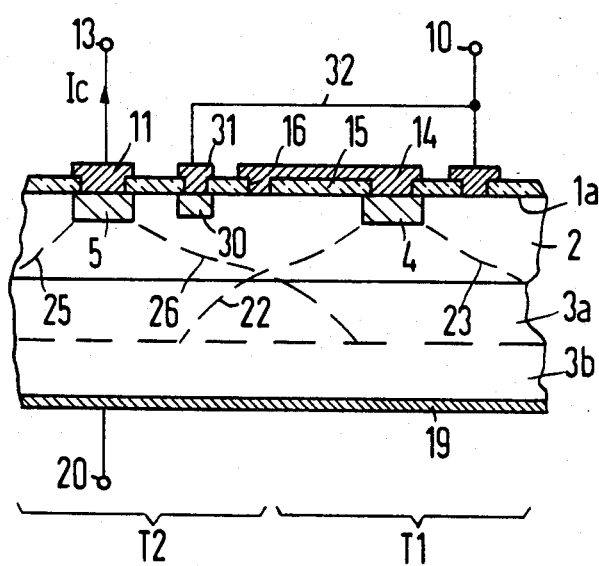

MONOLITHICALLY INTEGRATED BIPOLAR DARLINGTON CIRCUIT

BACKGROUND OF THE INVENTION

1. Field of the Invention:

This invention relates in general to monolithically integrated bipolar Darlington circuits and in particular to a novel circuit.

2. Description of the Prior Art:

The article "Power Bipolar Devices" by Ph.Leturcq in the periodical "Micro-Electronic Realiability" Volume 24, No. 2 1984, pages 313–337 including FIG. 16 on Page 333 discloses a monolithically integrated circuit. Depending on the switch on of the base current which is generated by a base current source connected between the base terminal and the emitter terminal, collector current is switched on in the switch mode and the collector current flows in an external load circuit connected to the emitter and to the collector terminal. Important parameters in the switch on of the collector current are the turn-on delay times $t_d$ and the rise time $t_r$ of the collector current. Defined as the time which is between the time when the base current reaches 10% of its maximum value and the time when the collector current reaches 10% of its final value is $t_d$. The time which is required for the rise of the collector current from 10% to 90% of its final value is $t_r$. When for the purpose of shutting the collector current off, the base current is reversed in direction then the collector current also begins to drop after a so-called storage time $t_s$ and this is then followed by a drop time $t_f$ in which the collector current drops from 90% of its final value to 10% of its final value.

In high voltage applications, for example, in the inhibited conditions of the Darlington circuit, a collector voltage of 1000 volts or more can exist between the emitter and the collector terminal and a collector current of, for example, 100 amps flows in the load circuit in the conductive condition such that a residual voltage of, for example, two volts occurs between the emitter terminal and the collector terminal of the output transistor.

SUMMARY OF THE INVENTION

It is an object of the invention to provide a Darlington circuit in which the switching behaviour is improved as compared to conventional circuits and this is achieved by providing a monolithically integrated bipolar Darlington circuit where the emitter of the output transistor and the driver transistor are composed of a plurality of emitter regions which are arranged such that each emitter region of the output transistor lies adjacent to at least one emitter region of the driver transistor and wherein every emitter region of the driver transistor is provided with a conductive coating which contacts the base layer between it and the neighboring emitter region of the output transistor.

An advantage obtained with the invention is that a significant reduction in the turn-on delay time $t_d$ and the storage time $t_s$ occurs so that an increase in the switching speed occurs when switching the collector current off and on.

Other objects, features and advantages of the invention will be readily apparent from the following description of certain preferred embodiments thereof taken in conjunction with the accompanying drawings although variations and modifications may be effected without departing from the spirit and scope and novel concepts of the disclosure and in which:

BRIEF DESCRIPTION OF THE DRAWINGS

FIG. 1 is a sectional view illustrating a first exemplary embodiment of the invention;

FIG. 2 is a sectional view illustrating a second exemplary embodiment;

FIG. 3 is a sectional view illustrating a third embodiment;

FIG. 4 is a sectional view illustrating a fourth embodiment; and

FIG. 5 is a sectional view illustrating a fifth embodiment.

DESCRIPTION OF THE PREFERRED EMBODIMENTS

FIG. 1 illustrates a wafer-shaped body 1 of doped semiconductor material as, for example, silicon in cross-section. The body 1 contains a first p-conductive layer 2 which extends up to the boundary surface 1a of the body 1. Below the layer 2 is an n-conductive layer 3 which is divided into an n-doped sublayer 3a and an n+doped sublayer 3b which is below the layer 3a. The doping concentrations can be, for example, in sublayer $3a = n_{3a} = 1 \times 10^{14}$ cm$^{-3}$. The doping concentration in the layer $3b = n_{3b} = 2 \times 10^{18}$ cm$^{-3}$. The layer 2 comprises a common base layer for bipolar npn transistors T1 through T4 and the layer 3 represents a collector layer which is shared by the transistors T1 through T4. There are inserted into the base layer 2 n-conductive emitter regions 4 through 7, respectively, which extend up to the boundary surface a. The emitter regions 4 through 7 are parts of the transistors T1 through T4 and have a doping concentration of $n = 5 \times 10^{20}$ cm$^{-3}$ (edge concentration at the boundary layer 1a).

The layer 2, for example, has a doping concentration of $10^{17}$ cm$^{-3}$ at the boundary surface of the emitter region 4. The transistors T1 and T3 are respectively provided with base contacts 8 and 9 which are connected to a base terminal 10. The emitter regions 5 and 7 of the transistors T2 and T4 are covered with emitter contacts 11 and 12 which are connected to an emitter terminal 13. The emitter 4 of the transistor T1 is provided with a conductive coating 14 which is extended beyond an insulating layer 15 of, for example, silicon dioxide which covers the boundary surface such that the coating 14 contacts the base layer 2 in the region of a window 16 of the layer 15. The window 16 is positioned between the emitter regions 4 and 5. In a similar manner the emitter region 6 of transistor T3 is provided with a conductive coating 17 which contacts the base layer 2 through a window 18 of the insulating layer 15 between the emitter regions 6 and 7.

The common collector layer is provided with a collector contact 19 which is electrically connected to a collector terminal 20. The semiconductor body 1 in FIG. 1 also contains further transistor combinations such as transistors T5, T6 through T (2n−1), and transistor T2n (not shown in detail) which are constructed similar to the combinations of the transistors T1, T2 or T4 and are connected in a similar fashion to the terminals 10, 13 and 20. These additional combinations are positioned to the left and right of the transistors T1, T2, T3 and T4 on portions not shown of the semiconductor body 1. The total number of transistors with odd numbers such as T1, T3, T5 . . . T(2n−1) forms the driver transistor and the total combination of the transistors of even numbers T2, T4, T6 . . . Tn2 form the output transistor of the Darlington circuit. The total number of the emitter regions 4, 6 etc. forms the emitter of the driver transistor; and the total number of the emitter regions 5, 7 etc. forms the emitter of the output transistor. As is illustrated in FIG. 1, the emitter regions 4, 6 etc. are interleaved with the emitter regions 5, 7 etc. such that every emitter region as, for example, 5 of the output transistors lies adjacent to at least one emitter region as, for example, region 4 of the driver transistor.

The arrangement of the emitter regions of the output transistor and of the driver transistor as illustrated in FIG. 1 is such that a respective emitter region for example 4 of the driver transistor lies between two emitter regions for example 5 and 7 of the output transistor. The conductive coating as, for example, the coating 14 of the emitter region, for example 4, contacts the base layer 2 at a location which lies between the emitter region for example 4 of the driver transistor and one of the two emitter regions, for example, 5 of the output transistor and a base contact, for example, 8 is positioned between the emitter region of the driver transistor under consideration and the other of the two emitter regions for example, 7 of the output transistor.

When the non-conductive condition of the Darlington circuit exists wherein a high voltage of, for example, 1000 volts exists between the terminals 20 and 13 and the terminal 20 is at a more positive potential than the terminal 13 located at reference potential and when a positive base current Ib is supplied by way of the base terminal 10, the positive charge carriers travel from the part of the base layer 2 lying below the base contact approximately in the direction of the arrow 21 to the positively biased pn junction between the emitters 5 and 4 by way of the conductive coating 14. The emitter region 4 then injects negative charge carriers into the base layer 2 such that these together with positive charge carriers which are flooded in by the base current Ib form a storage charge which is first built up below the emitter 4 in the base layer 2 and assuming a continuing base current finally extends to the sublayer 3a after removing the space charge zone between the portions 2 and 3a. The lateral boundaries of the storage charge under the emitter 4 are indicated by the broken lines 22 and 23. An expansion of the actual base zone of transistor T1 occurs both in the vertical as well as in the lateral direction such that the conductivity within this expanded base zone is significantly higher than would correspond to the basic doping of the layers 2 and 3a. The collector current Ic1 of the transistor T1 resulting therefrom flows by way of the coating 14 to the subregion of the base layer 2 in the region of the window 16 which it contacts. Positive charge carriers thus proceed from this location along the arrow 24 to the pn junction between the base 2 and the emitter 5. As a consequence, the emitter region 5 injects negative charge carriers which together with the positive charge carriers flooded in by Ic1 build up a storage charge below emitter region 5 which is indicated by the lateral dashed lines 25 and 26. A higher collector current Ic2 results for the transistor T2 as a consequence of the vertical and laterally expanded base zone of transistor T2 due to these events in which the conductivity is greatly increased.

Similar events also occur in the region of the additional transistor combinations T3, T4 . . . T(2n−1), Tn when the base current Ib is switched on such that the sum of the collector currents of the transistors T2, T4 . . . T2n forms the collector current Ic of the output transistor of the Darlington circuit.

When the storage charges within the individual transistor combinations as, for example, T1 and T2 mutually overlap as illustrated by the lines 22 through 26 in FIG. 1, then due to the build up of the storage charges of the transistors T1, T3 . . . T(2n−1), a respective part of the storage charges of the transistors T2, T4 . . . T2n will simultaneously be built up. This means, however, that the remaining build up of the storage charge of T2, T4 . . . T2n is accomplished far faster then would be the case without such overlap. A significant reduction in the turn-on delay $t_d$ thus results. This effect occurs with the structure of FIG. 1 wherein the thickness d of the semiconductor body 1 is greater than one-half the lateral spacing between two adjacent emitter regions as, for example, the emitter regions 5 and 7 of the output transistor between which an emitter region as, for example, the emitter region 4 of the driver transistor is located.

According to a preferred development of the invention, the width b of one of the emitter regions of the output transistor as, for example, emitter region 5 measured in the direction toward the adjacent emitter region, for example, the emitter region 7 is selected such that the width b of the emitter 5 is selected to be smaller than the lateral spacing between the two emitter regions, as for example, the emitter regions 5 and 7 which enclose an emitter region for example, 4 of the driver transistor between them. As is illustrated in FIG. 1, "b", is about 1/5 of such lateral spacing. Particularly, when high voltage transistors are involved, a fanning of the collector current paths of the transistors T2, T4 . . . T2n in the lateral direction occurs such that for a prescribed plurality of n transistor combinations, a reduction of the cross-sectional surface of the semiconductor body 1 measured in the plane of the boundary surface 1a resulting from the reduction of b can be utilized without having to accept a noticeable reduction of the maximum permitted collector current Ic of the Darlington circuit. Without a significant reduction of the maximum permitted collector current Ic, in particular, the width b can be advantageously selected to be smaller by about one order of magnitude then the lateral spacing. Assuming a lateral spacing of, for example, 100 micrometers, the width b can, for example be reduced to 10 micrometers. In traditional Darlington circuits the width of an emitter of the output transistor is 100 to 200 micrometers as contrasted to the present invention. The width of the emitter regions for example, the emitter 4 of the driver transistor in an inventive design of the circuit is expediently matched to the emitter width of the emitter regions of the output transistor or in a particular example 10 micrometers.

The overlapping storage charges within the individual transistor combinations T1, T2 . . . T(2n−1), T2n also result in a significant reduction of the storage times $t_s$ when an inversion in the direction of the base current occurs, in other words, when shut-off of the Darlington circuit occurs since the dissipation of the storage charge below an emitter region as, for example, the emitter region 4 of the driver transistor causes a part of the storage charge of the emitter region, for example, of the emitter 5 of the output transistor of the same combination to be simultaneously dissipated. A higher switching speed of the shut off of the collector current Ic thus results.

FIG. 2 illustrates a second exemplary embodiment of the invention wherein the arrangement of the emitter regions of the driver transistor and the output transistor is somewhat different from that illustrated in FIG. 1. The transistors T1 and T2 in FIG. 1 correspond to the transistors T1, T2 in FIG. 2 and have the same reference characters and are arranged similar to that illustrated in FIG. 1. The transistor combination of transistor T3 and T4 of FIG. 1 is constructed on the semiconductor body in FIG. 2 in a side inverted position and are referenced as transistors T3a and T4a. The base terminal 8 of transistor T1 and base terminal 9 of transistor T3 are combined to form a base terminal 8a which is shared by the transistors T1 and T3a. A further transistor combination T5a and T6a is constructed according to the combination T1 and T2 and is located next to the transistor T4a such that the emitter region of the output transistor of the transistor T6a and the emitter region of the transistor T6a and the emitter region of the transistor T6a are formed into a common emitter region 4a with the transistor T4a. In FIG. 2 thus two respective emitter regions, for example 4 and 4b of the driver transistor are located between two respective emitter regions of the output transistor as, for example, regions 5 and 4a whereby the conductive coating 14 of the emitter region 4 contacts the base layer 2 within a subregion 27 which is located between the regions 4 and 5 and the conductive coating 17a of the emitter region 4b of the driver transistor contacts the base layer 2 in the region of a subregion 28 which is located between the emitter region 4b of the driver transistor and the emitter region 4a of the output transistor. The base contact 8a shared by transistors T1 and T3a is provided between the emitter regions 4 and 4b. The thickness d of the semiconductor body is also greater than one-half the lateral spacing between two adjacent emitter regions, for example, the space between the emitter regions 4a and 5 of the output transistor.

The storage charges formed below the two emitter regins, for example, the emitters 4 and 5 of each and every transistor combination as, for example, the transistors T1, T2 overlap in FIG. 2 in the manner analogous to that of FIG. 1 so that the switching characteristic of the exemplary embodiment of FIG. 2 approximately corresponds to that of the circuit of FIG. 1. The above explained measures for reducing the width b of the individual emitter regions of the output transistor relative to the lateral spacing between two mutually adjacent emitter regions as, for example, the emitters 5 and 4a can also be applied to the circuit of FIG. 2 such that by these measures it is achieved that the cross-section of the semiconductor body 1 measured in the boundary surface 1a assuming a prescribed number of n of transistor combinations is reduced. The cross-sectional surface required overall is even smaller than in the circuit of FIG. 1 in the circuit of FIG. 2 due to the combination of respectively two emitter regions of the output transistor to form one region for example, the emitter region 4a and the combination of two respective base terminals to one base terminal for example terminal 8a.

FIG. 3 illustrates a different embodiment of the invention wherein the base layer 2 is not formed as a base layer which is shared in common by all of the transistors as in FIGS. 1 and 2 but the base layer is divided into individual island-shaped regions 2a, 2b etc. which individually, respectively, surround the emitter regions, for example, the emitter regions 4 and 5 of the driver transistor and the output transistor. The conductive coating of an emitter region, for example, the emitter region 4 of the driver transistor thus respectively contacts the island-shaped region for example the base area 2a which surrounds the neighboring emitter region for example, the emitter 5 of the output transistor. This assures that the conductive coating 14 does not act as a low resistant connection between the base 2b and the emitter 4 and thus the positive bias voltage at the pn junction between these parts will not be deteriorated. Assuming a pronounced positive bias voltage at the pn junction which can be achieved with the circuit of FIG. 3, the base current component supplied via the base contact 8 is supplied practically entirely to the emitter region 4 which guarantees a high transistor current gain of the Darlington circuit.

FIG. 4 illustrates another embodiment of the invention wherein the base layer 2 is retained as a common base layer shared in common by all of the transistors and a respective n conductive region 29 which preferably extends up to the boundary surface 1a is inserted between every emitter region, for example, emitter 4 of the driver transistor and the subregion, for example, 27 of the base layer 2 at which the conductive coating 14 extending from this emitter region contacts the layer 2. Likewise, there is prevented as a result that the conductive coating 14 represents a low resistant bridge of the pn junction between the base 2 and the emitter 4 and an adequate positive bias voltage is not established at the emitter 4.

In the development of FIG. 4 also the base current component supplied by way of the base terminal 8 is also supplied substantially completely to the emitter region 4 so that a high transistor current gain of the Darlington circuit is assured. It is expedient in the exemplary embodiments of FIGS. 1 and 2 so as to achieve an adequately high positive bias voltage at the pn junctions of base 2 and emitter 4 and base 2 and emitter 6 and so forth to extend the conductive coatings 14, 17 and so forth so that the subregions of the base layer 2 contacted by the conductive coatings 14 and 17 have a potential which is sufficiently negative as compared to the potential of the base layer 2 in the immediate environment of the emitter regions 4 and 6 and so forth from which the conductive coatings extend.

FIG. 5 illustrates another embodiment of the invention wherein a small n+ doped semiconductor region 30 which extends up to the boundary layer 1a is inserted into the base layer 2 in at least one, but preferably in all transistor combinations, for example, transistors T1, T2. The regions 30 are preferably inserted next to the emitter region, for example, emitter region 5 of the output transistor. Each of the semiconductor regions 30 is provided with a contact 31 which is electrically connected to the base terminal 10. Together with the adjacent subregions of the base layer 2 the region 30 forms a clear-out diode which is switched on when a negative voltage is connected to the base terminal 10 i.e. given shutoff of the collector current Ic. The clear-out diode causes an accelerated reduction of the storage charges, for example, the storage charges 22, 23 and 25 and 26. The storage time $t_s$ is thus substantially reduced. Clear-out diode 2, 30, 31 integrated in this manner replaces an external clear-out diode employed in traditional circuits which is switched between the base of the driver transistor and the base of the output transistor. The integrated clear out electrode 2, 30, 31 has a significant advantage in that only one contact 31 and one connection, for example, an interconnect 32 to the base terminal 10 is required for its connection in contrast to prior art devices wherein an external clear-out diode requires two leads and significantly increases the space requirement of the Darlington circuit.

A particular advantage of the clear-out diode 2, 30 and 31 results when it is respectively arranged in the individual transistor combinations between the emitter region for example, emitter region 5 and the subregion of the base layer, for example, under the window 16 which is contacted by the conductive coating as, for example, the coating 14 of the allocated emitter region, for example, 4 of the driver transistor. The storage times $t_s$ becomes even smaller with the larger the number of transistor combinations such as, for example, transistors T1 and T2 which are supplied with a clear-out diode 2, 30, 31 since the more transistor combinations are simultaneously cleared of their storage charges.

The integration of clear-out diodes 2, 30, 31 is expedient in every one of the illustrated and described embodiments of the invention 1 through 5 and even when designed according to FIGS. 3 and 4. The clear-out diodes are integrated with the particular advantage in embodiments of the invention wherein the width b of the emitter regions of the output transistor is selected to be significantly smaller than the lateral spacing between two such regions, for example, the emitters 5 and 7 or the emitters 5 and 4a. Thus, b can be dimensioned to be approximately one order of magnitude smaller than this lateral spacing.

In addition to the embodiments of the invention described herein, embodiments are also of significance wherein the cited semiconductor regions are respectively replaced by semiconductor regions of the opposite conductivity type whereby voltages are respectively currents of the respectively opposite operational sign are employed instead of the voltages or currents given as examples herein.

Although the invention has been described with respect to preferred embodiments, it is not to be so limited as changes and modifications can be made which are within the full intended scope of the invention as defined by the appended claims.

I claim as my invention:

1. A monolithically integrated bipolar Darlington circuit comprising, a driver transistor and an output transistor, formed in a semiconductor body (1) which contains a base layer (2) of a first conductivity type, a collector layer (3) of a second conductivity type below said base layer (2) a driver transistor emitter and an output transistor emitter, of said second conductivity type formed in said base layer (2) and separated a specified distance in a first direction, said emitter of said driver transistor conductively connected to a sub-region of said base layer lying between said driver and output transistors, and whereby said base layer, said emitter of said output transistor and said collector layer are, respectively, provided with a base terminal (10), an emitter terminal (13) and a collector terminal (20), said emitter of said output transistor is composed of a plurality of emitter regions (5, 7) which are provided with emitter contacts (12, 11) connected to said emitter terminal (13); said emitter of said driver transistor is composed of a plurality of emitter regions (4, 6) which are alternately arranged with said emitter regions (5, 7) of said output transistor such that each emitter region (5) of said output transistor lies next to at least one emitter region (4) of said driver transistor, whereby each emitter region of said driver transistor is provided with a conductive coating (14) which contacts said base layer (2) between it and one of said emitter regions (5) of said output transistor which is adjacent to said emitter region of said driver transistor; said base terminal (10) connected to a plurality of base contacts (8, 9) which are mounted on said base layer (2), respectively, adjacent to said emitter regions (4, 6) of said driver transistor; and a thickness (d) of said semiconductor body (1) is greater than one half of said specified distance between adjacent emitter regions (5, 7) of said output transistor between which at least one emitter region (4) of said driver transistor is located.

2. A monolithically integrated bipolar Darlington circuit according to claim 1 wherein a width (b) of an emitter region (5) of said output transistor measured in a direction toward a neighboring emitter region (7) of this transistor is smaller than the lateral spacing between these two emitter regions (5, 7).

3. A monolithically integrated bipolar Darlington circuit according to claim 2 wherein said width (b) of an emitter region (5) of said output transistor measured in the direction to a neighboring emitter region (7) of this transistor is smaller by an order of magnitude than said lateral spacing between these two emitter regions (5, 7).

4. A monolithically integrated bipolar Darlington circuit according to claims 2 or 3 wherein an emitter region (4) of said driver transistor is arranged between two emitter regions (5, 7) of said output transistor, a conductive coating (14) of said one emitter region (4) contacting said base layer (2) at a location which lies between said emitter region (4) of said driver transistor and said first (5) of said two emitter regions of said output transistor and wherein a base contact (5) is arranged between said emitter region (4) of said driver transistor and said second (7) of said two emitter regions of said output transistor.

5. A monolithically integrated bipolar Darlington circuit according to claims 2 or 3 wherein two emitter regions (4, 4b) of said driver transistor are arranged between two emitter regions (5, 4a) of said output transistor; wherein the conductive coating of said first emitter (4) of said two emitter regions of said driver transistor contacts said base layer (2) at a location (27) which lies between it and said first (5) of said two emitter regions of said output transistor; wherein a conductive coating (17a) of said second emitter region (4b) of said driver transistor contacts said base layer (2) at a location (28) which lies between said second emitter region of said driver transistor and said second emitter (4a) of said two emitter regions of said output transistor; and wherein a base contact (8a) is arranged between said two emitter regions (4, 4b) of said driver transistor.

6. A monolithically integrated bipolar Darlington circuit according to claims 1, 2 or 3 wherein said base layer is divided into a plurality of island-shaped regions (2a, 2b) which respectively individually surround said emitter regions (5, 4) of said output transistor and of said driver transistor; and wherein a conductive coating (14) of one emitter region (4) of said driver transistor respectively contacts the island-shaped region (2a) of said base layer which surrounds the adjacent emitter region (5) of said output transistor.

7. A monolithically integrated bipolar Darlington circuit according to claims 1, 2 or 3 wherein an island-shaped region (29) of said second conductivity type is respectively inserted into said base layer (2) between one emitter region (4) of said driver transistor and the location (27) at which said conductive coating (14) of said one emitter region contacts said base layer (2).

8. A monolithically integrated bipolar Darlington circuit according to claims 1, 2 or 3 wherein said collector layer (3) is composed of a weakly doped sub-layer (3a) of said second conductivity type which lies under said base layer (2) and is further composed of a highly doped sub-layer (3b) of the same conductivity type which lies below said weakly doped sub-layer.

9. A monolithically integrated bipolar Darlington circuit according to claims 1, 2 or 3 wherein a respective island-shaped semiconductor region (30) of said second conductivity type is inserted into said base layer (2) next to at least one but preferably next to all of said emitter regions (5) of said output transistor, said island-shaped semiconductor region (30) extending up to a the boundary surface (1a) of said semiconductor body (1) and comprising a contact (31) which is connected to said base terminal (10).

10. A monolithically integrated bipolar Darlington circuit according to claim 9, wherein said island-shaped semiconductor region (30) is positioned next to said emitter region (5) of said output transistor such that it lies between said emitter regions and the location at which a conductive coating (14) of a neighboring emitter region (4) of said driver transistor contacts said base layer (2).

* * * * *